United States Patent
Takano et al.

(10) Patent No.: US 9,443,717 B2
(45) Date of Patent: Sep. 13, 2016

(54) CONVEYANCE SYSTEM AND CONVEYANCE METHOD

(71) Applicant: HIRATA CORPORATION, Shinagawa-ku, Tokyo (JP)

(72) Inventors: Junji Takano, Tokyo (JP); Hiroya Mitsushima, Tokyo (JP)

(73) Assignee: HIRATA CORPORATION, Shinagawa-Ku, Tokyo (JP)

( * ) Notice: Subject to any disclaimer, the term of this patent is extended or adjusted under 35 U.S.C. 154(b) by 0 days.

(21) Appl. No.: 14/792,105

(22) Filed: Jul. 6, 2015

(65) Prior Publication Data

US 2016/0016739 A1  Jan. 21, 2016

(30) Foreign Application Priority Data

Jul. 16, 2014 (JP) ................. 2014-146284
Apr. 9, 2015 (JP) ................. 2015-080341

(51) Int. Cl.
*H01L 21/02* (2006.01)

(52) U.S. Cl.
CPC .............. *H01L 21/02274* (2013.01)

(58) Field of Classification Search
CPC ............................ B65G 17/002; D01H 9/187
USPC ............ 198/413, 345.1, 346.1, 346.2, 346.3; 414/788.8
See application file for complete search history.

(56) References Cited

FOREIGN PATENT DOCUMENTS

| JP | 3187564 B2 | 5/2001 |
| JP | 2001-354203 A | 12/2001 |
| JP | 2011-126682 A | 6/2011 |
| JP | 2012-166318 A | 9/2012 |

*Primary Examiner* — Gene Crawford
*Assistant Examiner* — Lester Rushin
(74) *Attorney, Agent, or Firm* — Buchanan Ingersoll & Rooney PC

(57) ABSTRACT

A conveyance system according to the present invention includes a processing station, first to third conveyance apparatuses arranged in a conveying direction of a work piece. The second conveyance apparatus is provided in the station. The system further includes a lifting apparatus disposed below the second conveyance apparatus in the station, and a processing apparatus in the processing station. The first and second conveyance apparatuses perform returning of the pallet that is empty in a direction reverse to the conveyance direction.

11 Claims, 12 Drawing Sheets

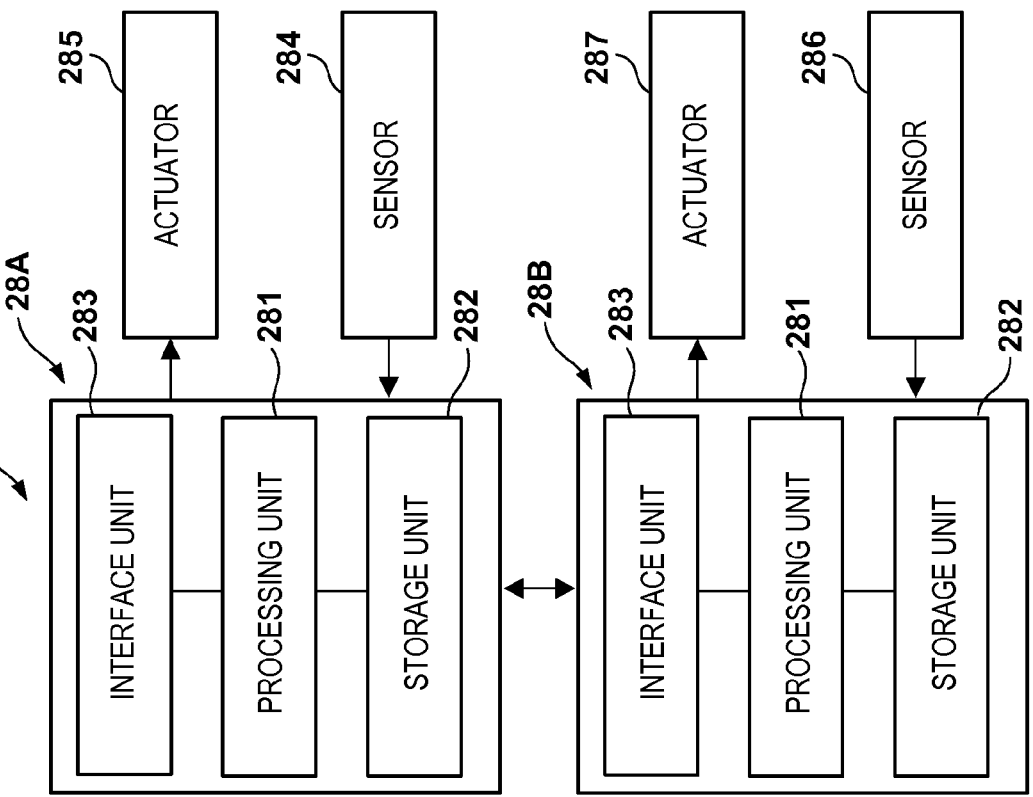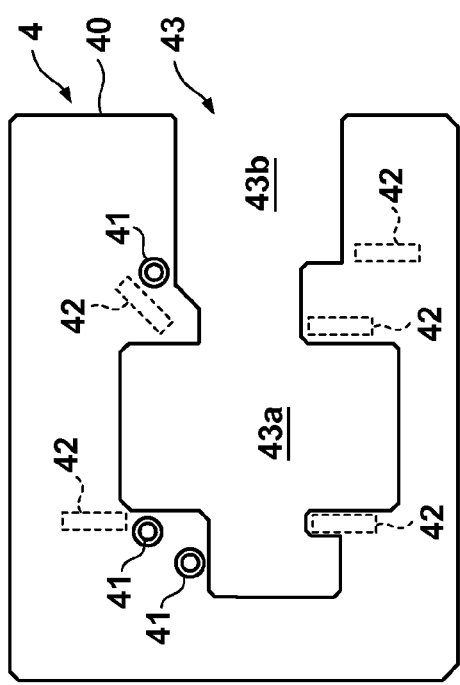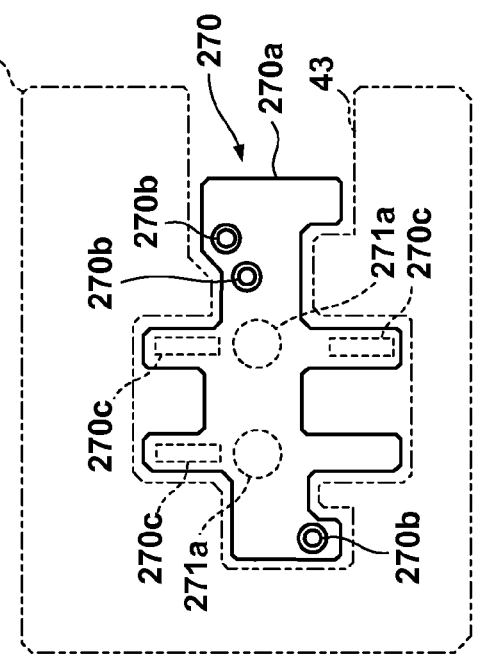

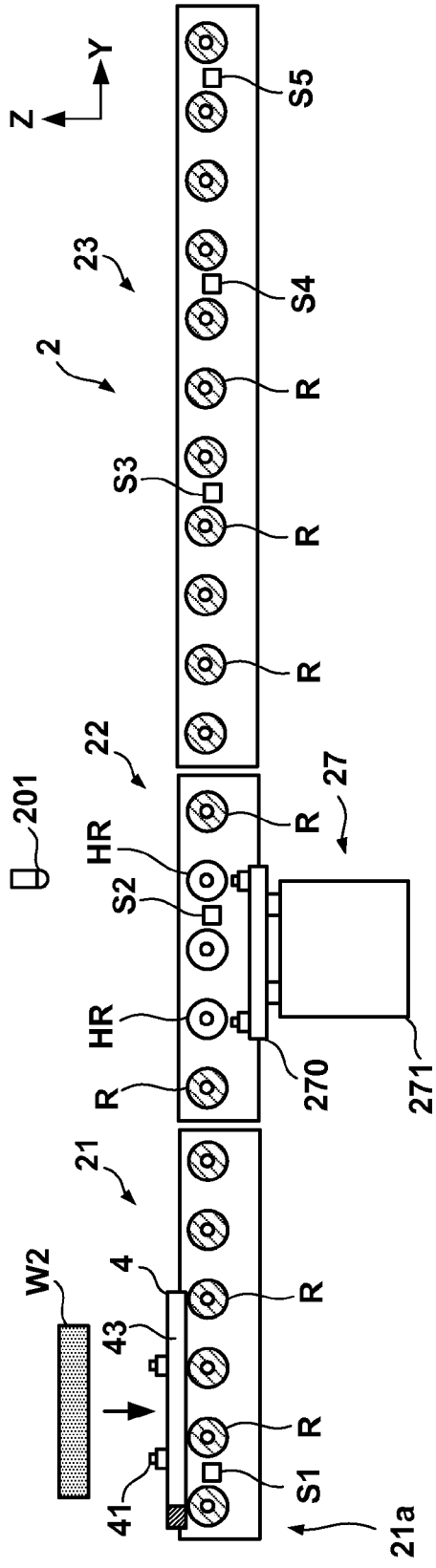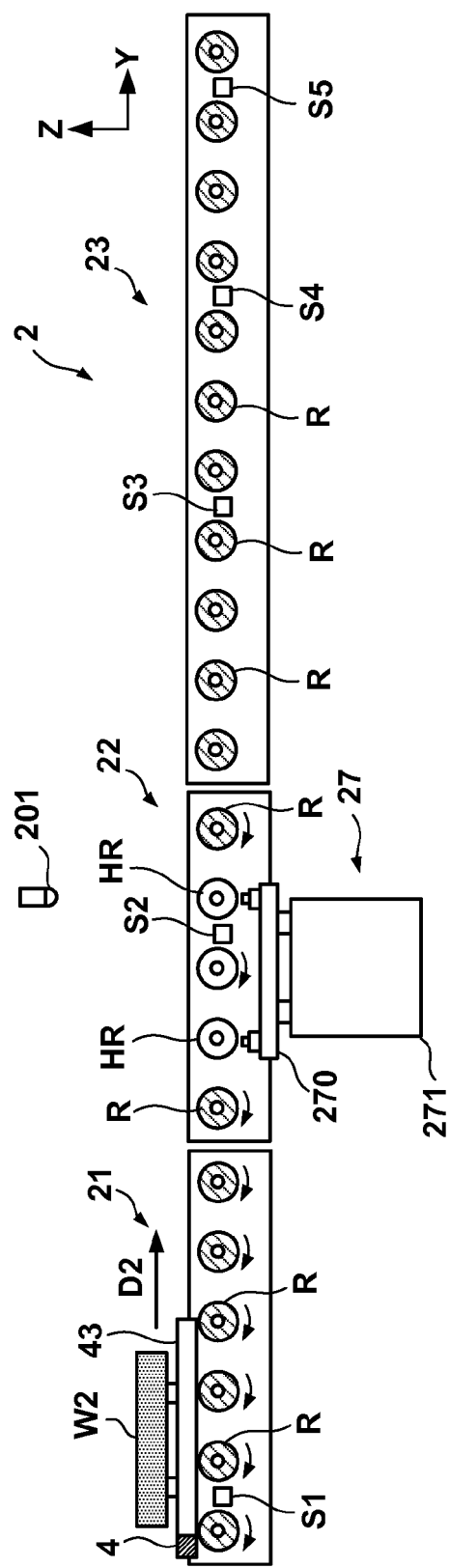

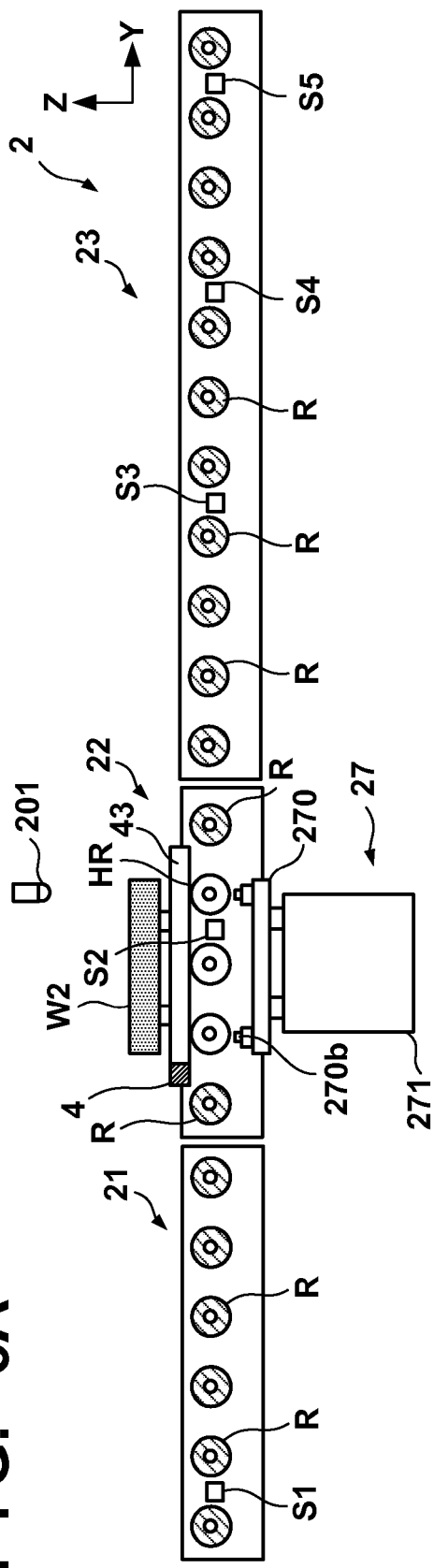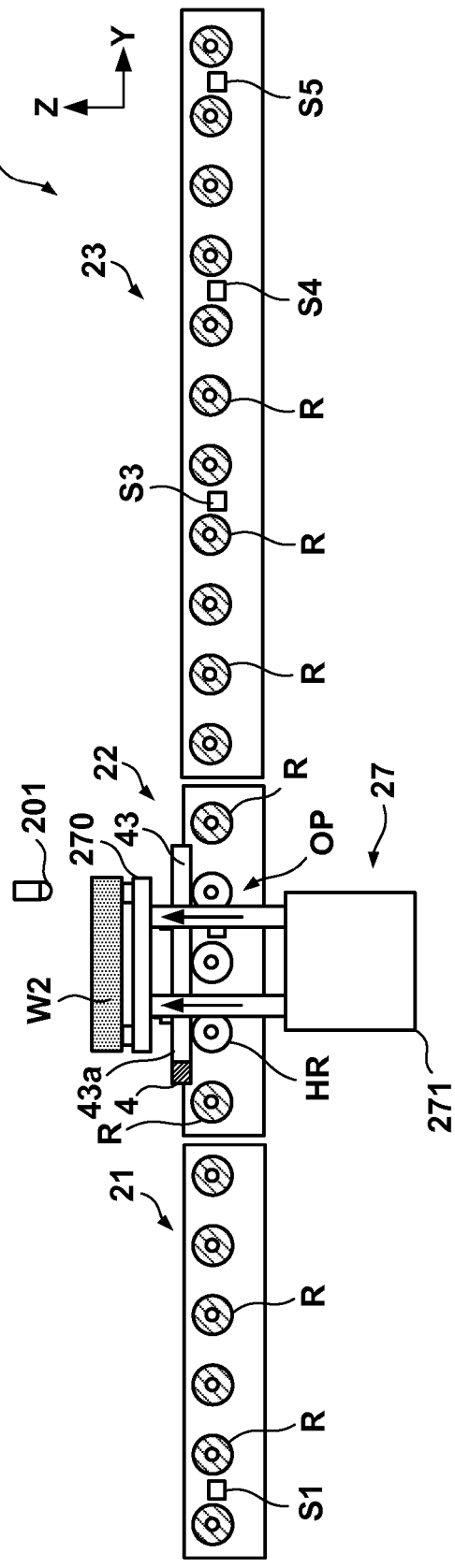

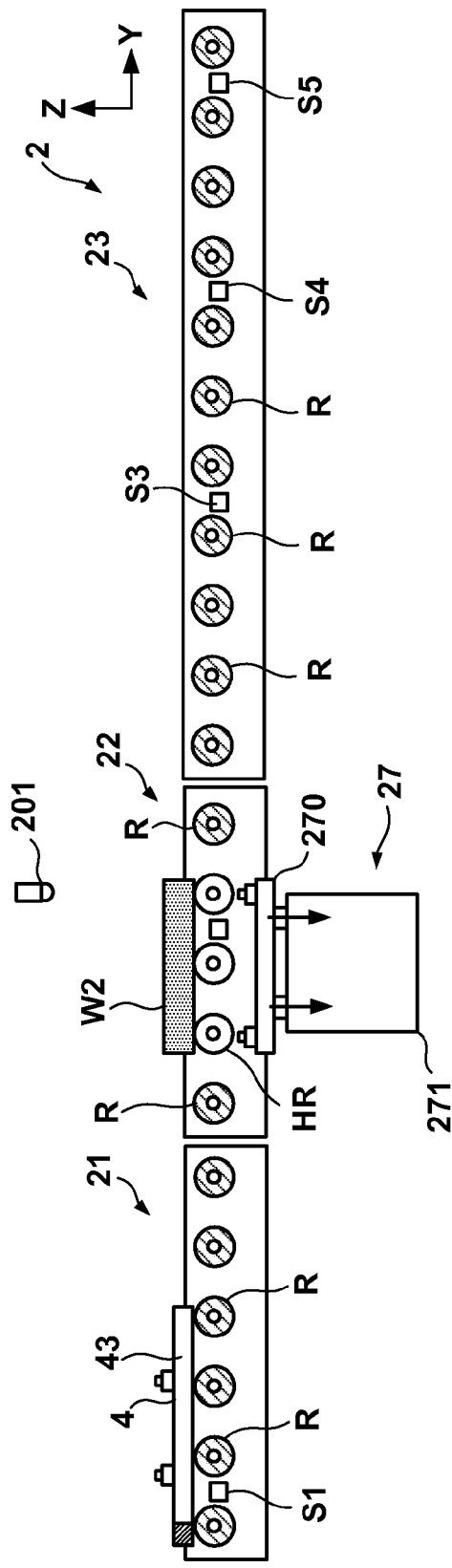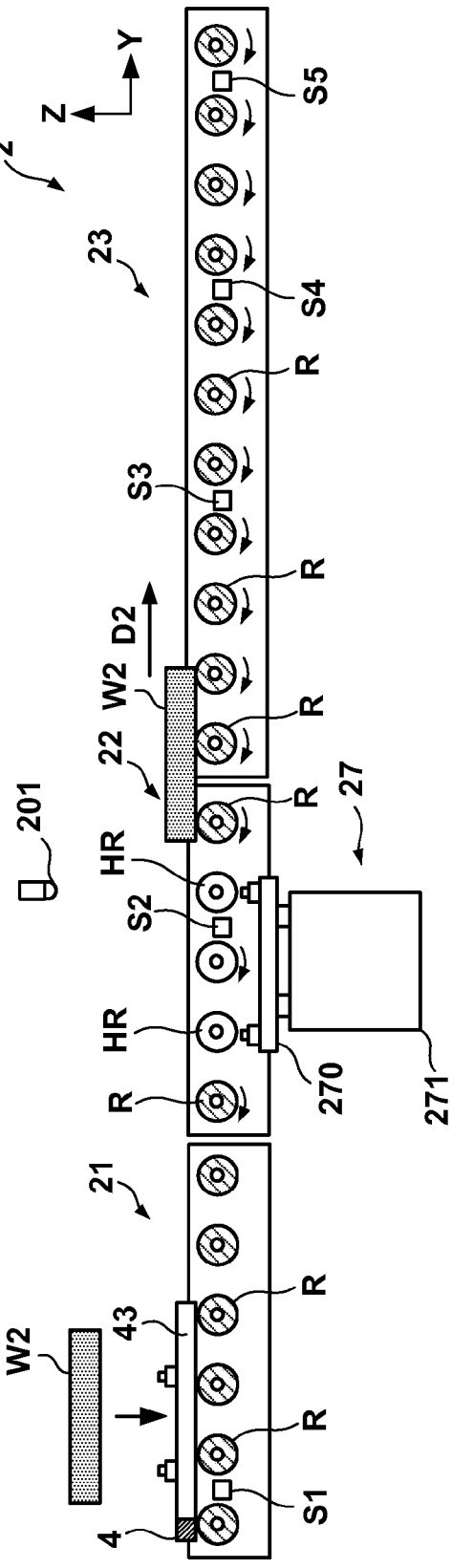

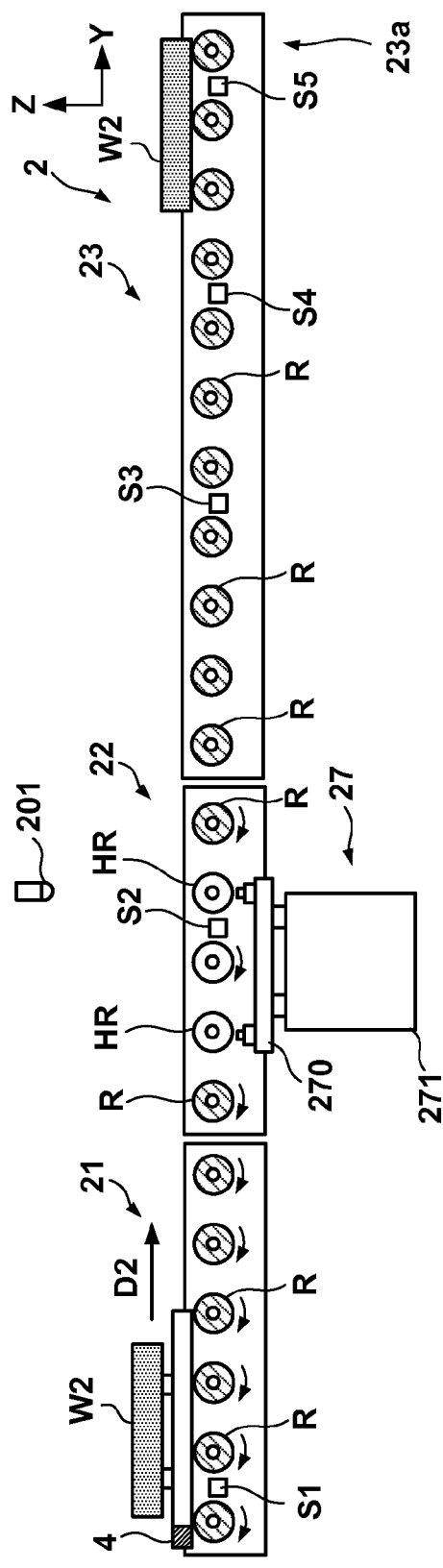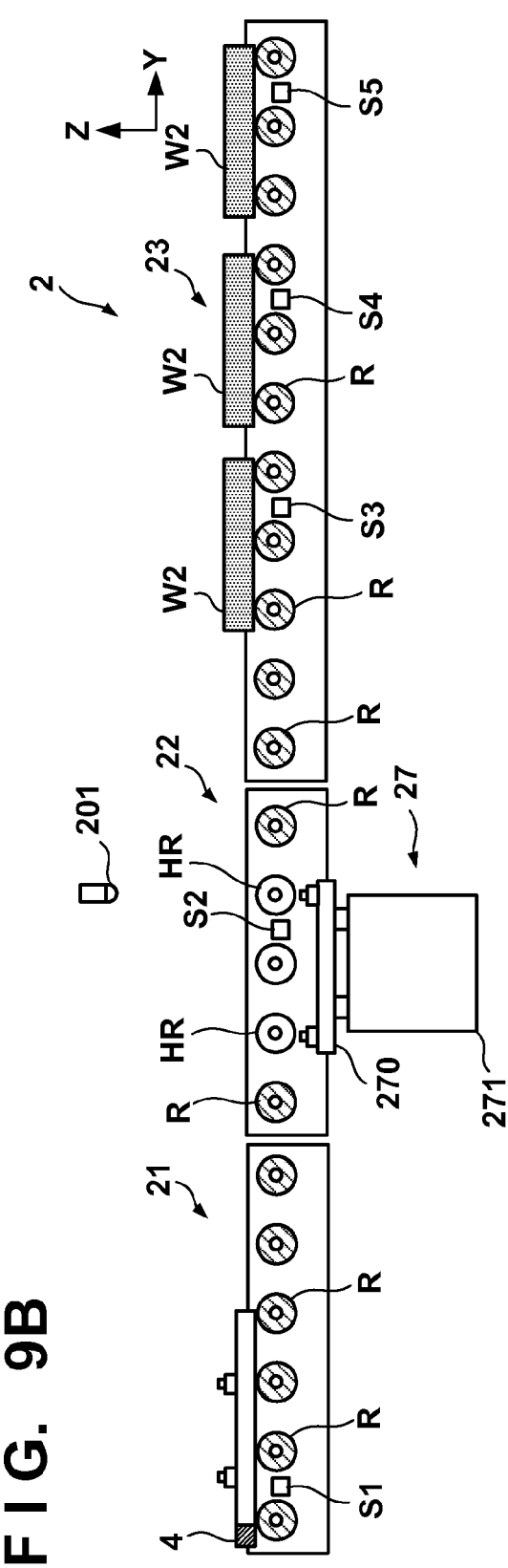

CONVEYANCE SYSTEM AND CONVEYANCE METHOD

BACKGROUND OF THE INVENTION

1. Field of the Invention

The present invention relates to a conveyance system and a conveyance method.

2. Description of the Related Art

As a conveyance system for work pieces, a conveyance system conveying work pieces placed on pallets (see Japanese Patent Laid-Open No. 2011-126682, Japanese Patent No. 3187564, Japanese Patent Laid-Open No. 2001-354203, for example; referred to as a "pallet conveyance" in some cases), and a conveyance system directly conveying work pieces using no pallets (see Japanese Patent Laid-Open No. 2012-166318, for example; referred to as a "direct conveyance" in some cases) have been proposed.

In the direct conveyance, work pieces are likely to be out of position during conveyance. Hence, a positioning apparatus may be required if work pieces are required to be positioned during the conveyance. Meanwhile, in the pallet conveyance, work pieces are positioned relative to pallets; thus the work pieces are unlikely to be out of position during the conveyance. However, it is necessary to additionally provide mechanisms, such as pallet return lines, for returning the pallets from conveyance destinations to conveyance origins, which results in increase in footprint. In addition, it is necessary to prepare a certain number of pallets for each work piece size.

In facilities where positioning accuracy of work pieces is required from a conveyance origin to a processing station, and no positioning accuracy of the work pieces is required from the processing station to a conveyance destination, the direct conveyance system is disadvantageous in that a positioning apparatus is required. To the contrary, the pallet conveyance system is disadvantageous in that a mechanism for returning the pallets to the conveyance origin and a number of pallets are required.

SUMMARY OF THE INVENTION

An object of the present invention is to secure positioning accuracy at a processing station without additionally requiring a positioning apparatus and or a mechanism for returning pallets.

According to an aspect of the present invention, there is provided a conveyance system including a processing station that processes a work piece fed in and feeds out the work piece after being processed, the conveyance system comprising: a first conveyance apparatus that feeds in the work piece into the processing station; a second conveyance apparatus provided in the processing station and disposed subsequently adjacent to the first conveyance apparatus at a downstream side of the first conveyance apparatus in a conveyance direction of the work piece; a third conveyance apparatus disposed subsequently adjacent to the second conveyance apparatus at a downstream side of the second conveyance apparatus in the conveyance direction, the third conveyance apparatus conveying the work piece fed out from the processing station; a lifting apparatus disposed below the second conveyance apparatus in the processing station and moving the work piece upward and downward; and a processing apparatus disposed in the processing station and processing the work piece lifted up by the lifting apparatus, wherein the first conveyance apparatus performs conveyance of a pallet on which the work piece is placed in the conveyance direction and returning of the pallet that is empty in a direction reverse to the conveyance direction, the second conveyance apparatus performs conveyance of the pallet on which the work piece is placed in the conveyance direction, returning of the pallet that is empty in the direction reverse to the conveyance direction and conveyance of the work piece in the conveyance direction, the lifting apparatus performs lifting of the work piece placed on the pallet on the second conveyance apparatus and moving the work piece down onto the second conveyance apparatus, and the third conveyance apparatus performs the conveyance of the work piece in the conveyance direction.

According to another aspect of the present invention, there is provided a conveyance method for conveying a work piece from an upstream of a conveyance direction of the work piece through a processing station to a downstream of the conveyance direction, the conveyance method comprising: a pallet conveyance step of moving a pallet on which the work piece is placed in the conveyance direction on a predetermined conveyance surface so as to convey the pallet to the processing station; a separating step of moving the work piece placed on the pallet that has reached the processing station upward from the conveyance surface so as to separate the work piece from the pallet; a pallet returning step of returning the pallet, which is empty after the work piece is lifted up, toward the upstream of the conveyance direction on the conveyance surface; a processing step of processing the work piece lifted up in the separating step at the processing station; a moving-down step of moving the work piece after being processed down onto the conveyance surface; and a work-piece conveyance step of conveying the work piece put down onto the conveyance surface in the conveyance direction.

Further features of the present invention will become apparent from the following description of exemplary embodiments (with reference to the attached drawings).

BRIEF DESCRIPTION OF THE DRAWINGS

FIG. 4A is a plan view of a pallet; FIG. 4B is a plan view of a push-up unit; and FIG. 4C is a block diagram of each control unit of the conveyance system in FIG. 2;

FIG. 5A and FIG. 5B are explanatory views of operation of the conveyance system in FIG. 2;

FIG. 6A and FIG. 6B are explanatory views of the operation of the conveyance system in FIG. 2;

FIG. 8A and FIG. 8B are explanatory views of the operation of the conveyance system in FIG. 2;

FIG. 9A and FIG. 9B are explanatory views of the operation of the conveyance system in FIG. 2;

DESCRIPTION OF THE EMBODIMENTS

<Application Example>

Figure 1:
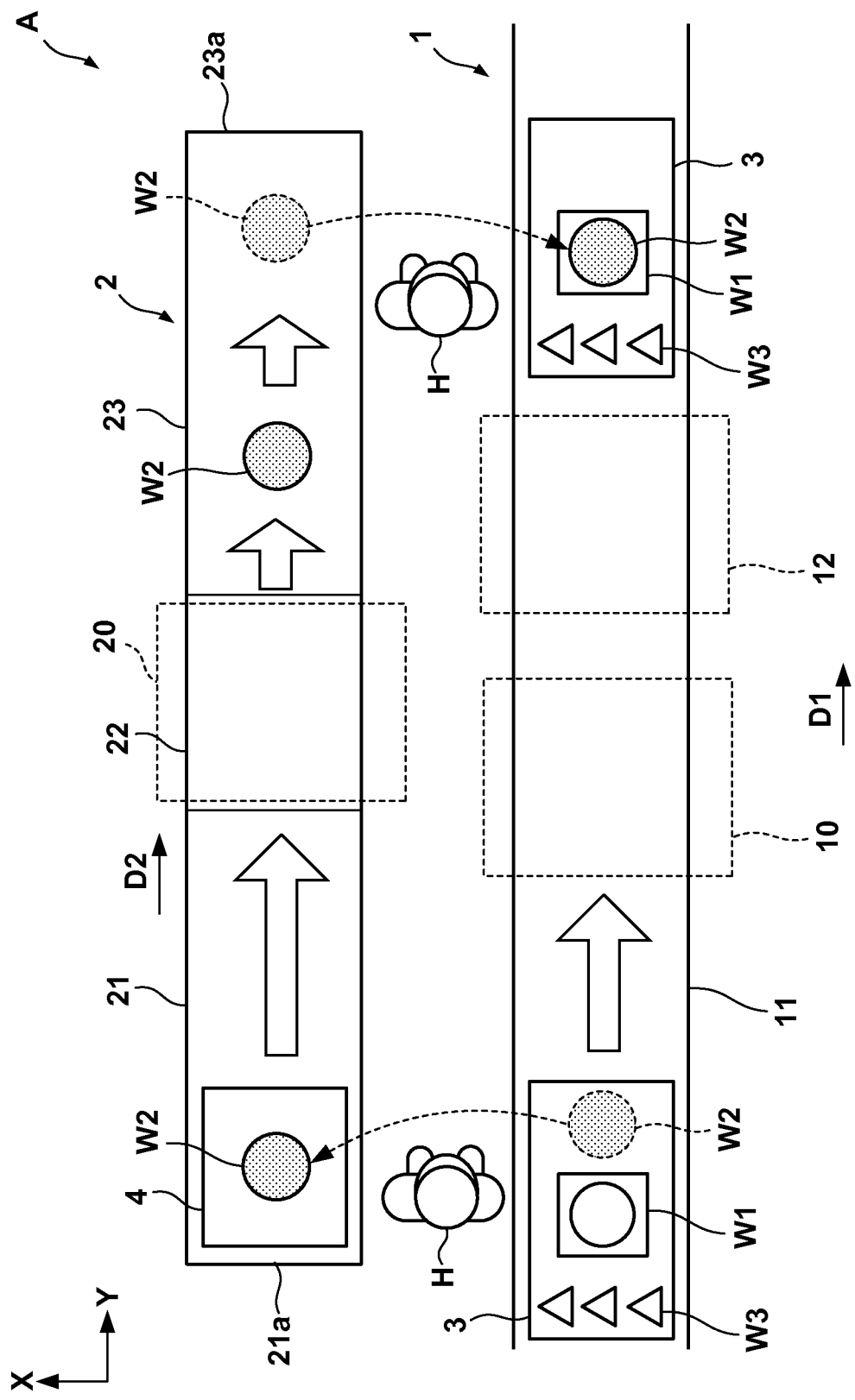
FIG. 1 shows a layout of production facilities to which the present invention is applied.

FIG. 1 shows a layout of production facilities A to which the present invention is applied. The production facilities A include a conveyance system 1 forming a main conveyance line, and a conveyance system 2 forming a sub-conveyance line. The conveyance system 2 is a conveyance system according to one embodiment of the present invention. In each drawing, an arrow X and an arrow Y indicate a horizontal direction where these arrows X and Y are orthogonal to each other, and an arrow Z indicates a vertical direction (upward and downward direction).

The conveyance system 1 includes a conveyance apparatus 11 that conveys each pallet 3 on which work pieces W1 to W3 are placed in an arrow D1 direction. The conveyance apparatus 11 is a conveyor, such as a roller conveyor and a belt conveyor, for example. The arrow D1 direction is parallel with the Y direction.

On the way of a conveyance passage of the pallet 3 conveyed by the conveyance apparatus 11, there are provided processing stations 10, 12. The conveyance apparatus 11 feeds in and feeds out each pallet 3 to the processing stations 10, 12. The processing stations 10, 12 perform predetermined processing on the work piece W1 placed on the pallet 3.

The conveyance system 2 includes a processing station 20 that performs processing on each work piece W2 that is fed in, and feeds out the processed work piece 2. The conveyance system 2 is arranged side by side with the conveyance system 1, and some of the work pieces (work pieces W2) conveyed by the conveyance system 1 are subjected to the processing by the processing station 20. The conveyance system 1 and the conveyance system 2 allow each work piece W1 and each work piece W2 to be processed in parallel.

The conveyance system 2 includes conveyance apparatuses 21 to 23 that convey the work piece W2 in an arrow D2 direction. The arrow D2 direction is parallel with the Y direction. Hence, the conveyance system 1 has a conveyance direction of the work pieces in parallel with that of the conveyance system 2. The conveyance directions of the conveyance systems 1, 2 may not be parallel with each other. Each of the conveyance system 1 and the conveyance system 2 conveys the work piece on a linear track, but may also convey the work piece on a curved track. In the following description, an upstream and a downstream are defined with reference to the respective conveyance directions D1, D2.

In the conveyance system 2, the pallet 4 on which the work piece W2 is placed is conveyed from a conveyance origin 21a to the processing station 20. This means that the conveyance from conveyance origin 21a to the processing station 20 is a pallet conveyance. Meanwhile, from the processing station 20 to a conveyance destination 23a, the work piece W2 is conveyed without using the pallet 4. This means that the conveyance from the processing station 20 to the conveyance destination 23a is a direct conveyance.

A specific example of the operation will be described, hereinafter. The work piece W1 is a transmission case for a vehicle, for example, and the work piece W2 is a torque converter case, for example. The work piece W3 is a group of components to be assembled to the work piece W1, for example. The production facilities A are facilities for bonding each work piece W1 and each work piece W2.

Each set of the work pieces W1 to W3 is conveyed on each pallet 3. In the vicinity of the conveyance origin 21a of the conveyance system 2, an operator H takes out the work piece W2 from the pallet 3, and transfers the work piece W2 onto the pallet 4. The pallet 3 is conveyed to the processing station 10, where an adhesive surface of the work piece W1 is subjected to roughening treatment (e.g. plasma exposure). Simultaneously, the pallet 4 is conveyed to the processing station 20, where an adhesive surface of the work piece W2 is subjected to the same roughening treatment. Subsequently, the pallet 3 is conveyed to the processing station 12, where the adhesive surface of the work piece W1 is subjected to an adhesive applying treatment. Simultaneously, the work piece W2 is conveyed from the processing station 20 to the conveyance destination 23a.

In the vicinity of the conveyance destination 23a of the conveyance system 2, the operator H takes out the work piece W2 from the conveyance apparatus 23, and transfers the work piece W2 onto the work piece W1 after being treated on the pallet 3. While being transferred, the work piece W2 is turned over to be laid over the work piece W1, thereby bonding the work piece W1 and the work piece W2. The method of transferring the work piece W2 on the pallet 3 in the conveyance system 1 onto the pallet 4 in the conveyance system 2, and the method of transferring the processed work piece W2 in the conveyance system 2 onto the pallet 3 in the conveyance system 1 are not limited to manual operation by the operator H. For example, these transfer methods may be carried out with automated operation by a not-shown transfer machine (e.g., vertically articulated robot).

The common processing (roughening treatment) between the work piece W1 and the work piece W2 is performed in parallel, thereby enhancing operational efficiency (reduction in tact time).

<Configuration of Conveyance System>

Figure 2:
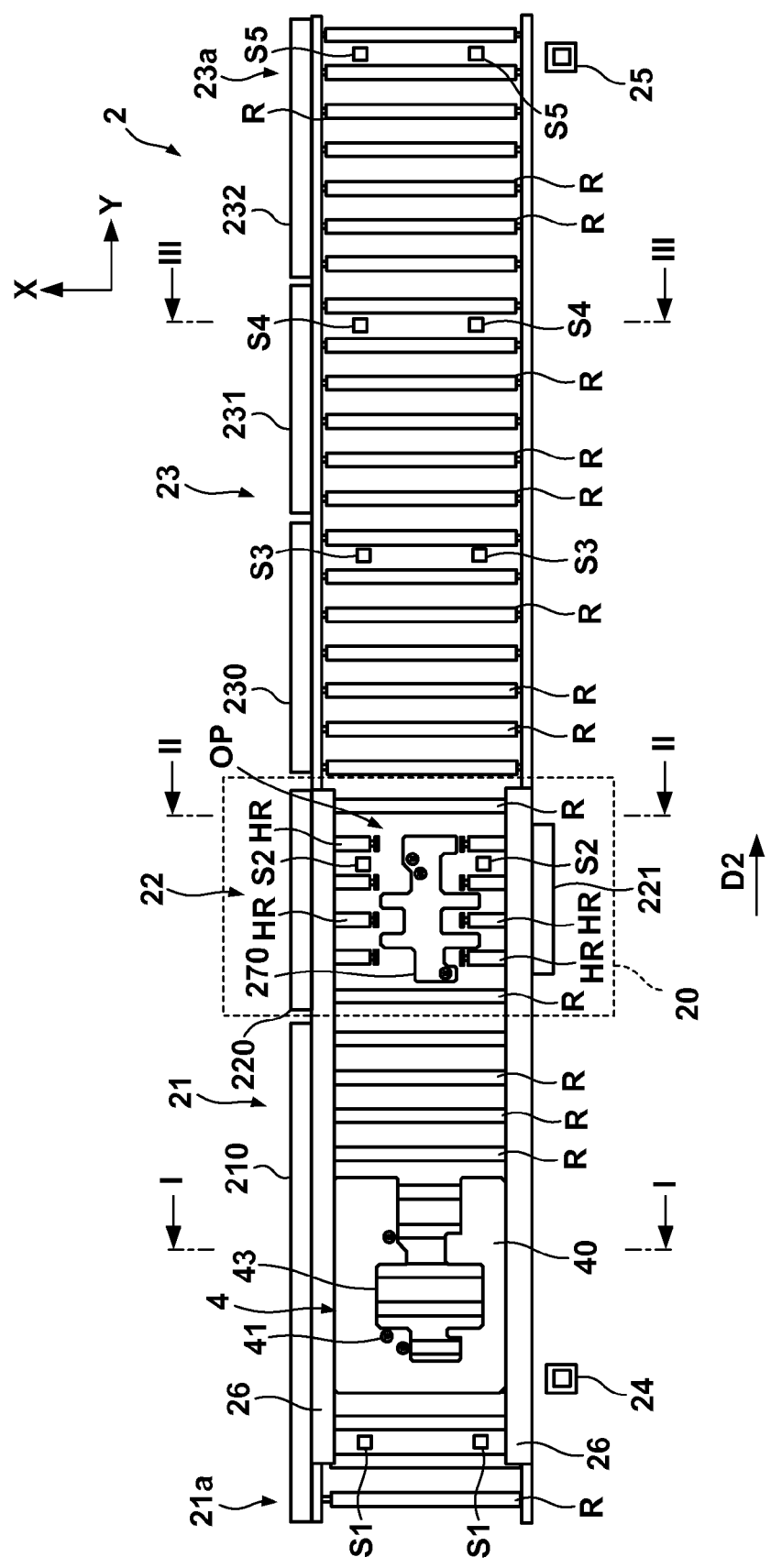
FIG. 2 shows a layout of a conveyance system according to one embodiment of the present invention.
Figure 3A:
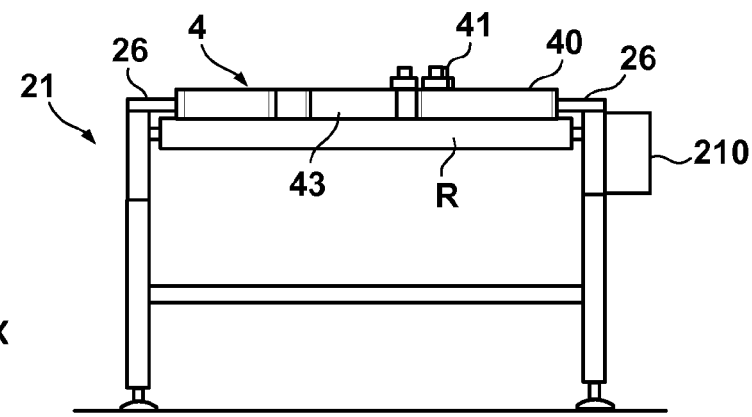
FIG. 3A is an arrow view taken along line I-I in FIG. 2.
Figure 3B:
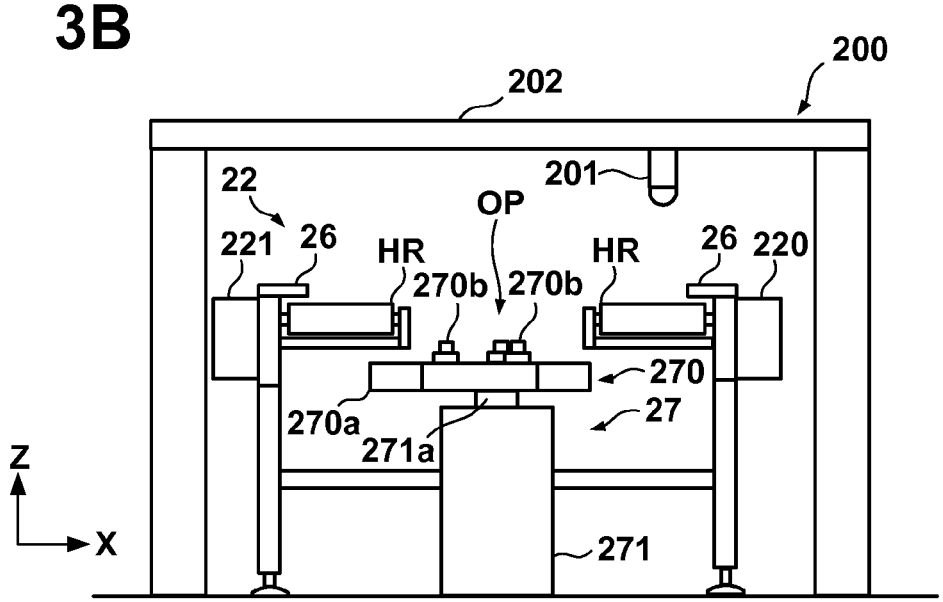
FIG. 3B is an arrow view taken along line II-II in FIG. 2.
Figure 3C:
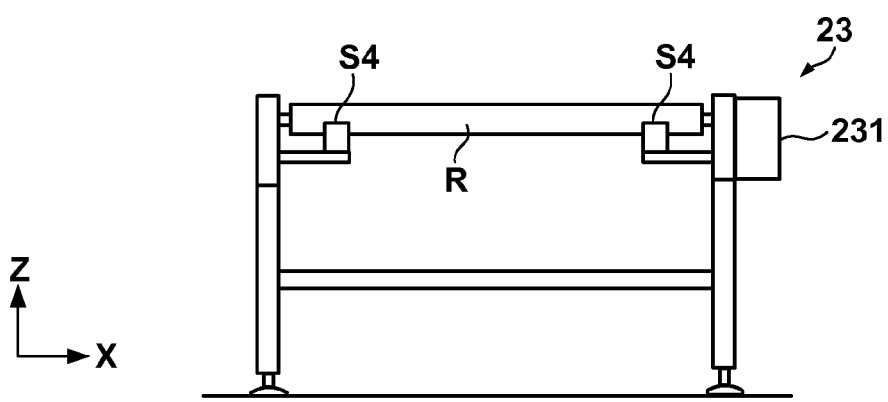
FIG. 3C is an arrow view taken along line III-III in FIG. 2.

The configuration of the conveyance system 2 will be described with reference to FIG. 2 and FIG. 3A to FIG. 3C. FIG. 2 shows a layout of the conveyance system 2. FIG. 3A is an arrow view taken along line I-I in FIG. 2; FIG. 3B is an arrow view taken along line II-II in FIG. 2; and FIG. 3C is an arrow view taken along line III-III in FIG. 2.

As briefly described above, the conveyance system 2 includes the processing station 20 and the conveyance apparatuses 21 to 23. In the case of the present embodiment, each of the conveyance apparatuses 21 to 23 is a roller conveyor including plural rollers R. However, each of these conveyance apparatuses may be another conveyor, such as a belt conveyor. Alternatively, a conveyance mechanism other than a conveyor may also be employed. Each roller R extends in a direction vertical to the conveyance direction D2, and both ends thereof are rollably supported. In the present embodiment, all the rollers R are configured to be driven rollers, but some of them may be configured to be free rollers.

The conveyance apparatus 21 has one end constituting the conveyance origin 21a, and conveys the work piece W2 to the processing station 20. Each roller R included in the conveyance apparatus 21 is driven by a driving unit 210. The driving unit 210 includes a driving source (e.g., a motor), and a transmission mechanism (e.g., a chain transmission mechanism, or a gear mechanism) for transmitting driving force of the driving source to each roller R.

The conveyance apparatus 22 is provided in the processing station 20 so as to be disposed subsequently adjacent to the conveyance apparatus 21 in a downstream of the conveyance apparatus 21. The conveyance apparatus 22 includes plural rollers R, and plural pairs (four pairs in FIG. 2) of rollers HR. The rollers HR are shorter than the rollers R. The rollers HR in each pair are disposed in a manner as to oppose each other relative to the rolling axial direction (X direction), and an opening OP through which a push-up unit 270 described later can pass is formed by space between each pair of the rollers HR. The rollers R or the rollers HR included in the conveyance apparatus 22 are driven by a driving unit 220 or a driving unit 221. Each of the driving units 220, 221 includes a driving source (e.g., a motor), and a transmission mechanism (e.g., a chain transmission mechanism, or a gear mechanism) for transmitting driving force of the driving source to each roller R or each roller HR.

The conveyance apparatuses 21, 22 include respective guide members 26, 26 that guide traveling of the pallet 4. The guide members 26, 26 are fixedly disposed at both sides of each conveyance surface of the conveyance apparatuses 21, 22 in a manner as to extend in the conveyance direction (Y direction). A spaced distance between the guide members 26, 26 is set in accordance with the width of the pallet 4 in the X direction, and the both ends of the pallet 4 are restricted by the respective guide members 26, 26, thereby straightly conveying the pallet 4. These guide members 26, 26 maintain a posture of the pallet 4 during the conveyance so that not only the pallet 4 but also the work piece W2 are conveyed while being in the positioned state.

The conveyance apparatus 23 is so disposed as to be subsequently adjacent to the conveyance apparatus 22 in the downstream of the conveyance apparatus 22. The conveyance apparatus 23 has one end constituting the conveyance destination 23a, and conveys the work piece W2 from the processing station 20 to the conveyance destination 23a. The rollers R included in the conveyance apparatus 23 are driven by driving units 230 to 232. Each of the driving units 230 to 232 includes a driving source (e.g., a motor), and a transmission mechanism (e.g., a chain transmission mechanism, or a gear mechanism) for transmitting driving force of the driving source to each roller R.

The driving unit 230 drives a group of rollers R located in the upstream. The driving unit 231 drives a group of rollers R located in the intermediate position. The driving unit 232 drives a group of rollers R located in the downstream. In the present embodiment, it is configured that the rollers R included in the conveyance apparatus 23 are classified into three groups in the conveyance direction D2, and each group is individually drivable. However, it may also be configured that all the rollers R are driven by a single driving unit.

The processing station 20 is provided with a lifting apparatus 27 and a processing apparatus 200. The lifting apparatus 27 is located below the conveyance apparatus 22 so as to move the work piece W2 upward and downward. In the case of the present embodiment, the lifting apparatus 27 includes the push-up unit 270 and a driving mechanism 271.

The push-up unit 270 is located immediately below the opening OP, and is configured to pass through the opening OP and the space between the rollers HR, thereby allowing the push-up unit 270 to pass through the conveyance apparatus 22 in the Z direction. The driving mechanism 271 is a mechanism for moving the push-up unit 270 upward and downward. The driving mechanism 271 is an air cylinder, and the push-up unit 270 is fixed at upper ends of rods 271a of the driving mechanism 271. As the driving mechanism 271, an electric cylinder or a rack-pinion mechanism may also be employed other than an air cylinder.

The processing apparatus 200 is an apparatus for processing each work piece W2 lifted up by the lifting apparatus 27. In the case of the present embodiment, as described later, it is configured that the processing apparatus 200 performs processing on the work piece W2 while the work piece W2 is supported by the lifting apparatus 27. The processing apparatus 200 may also be configured such that the processing apparatus 200 takes in the work piece W2 from the lifting apparatus 27, and also processes the work piece W2, and after the processing, the processing apparatus 200 transfers this work piece W2 to the conveyance apparatus 22.

Various types of processing may be adoptable as the processing carried out by the processing apparatus 200; but in the case of the present embodiment, in the light of the above exemplified operation, it is supposed to adopt plasma exposure. The processing apparatus 200 includes a jet nozzle 201 for atmospheric pressure plasma, and a movement mechanism 202 that moves the jet nozzle 201 to any position in an X-Y plane. The movement mechanism 202 may be a gantry-type movement mechanism, for example. The atmospheric pressure plasma is injected from the jet nozzle 201 toward the work piece W2, and simultaneously, the injecting position is moved by the movement mechanism 202.

The conveyance system 2 includes sensors S1 to S5. The sensor S1 and the sensor S2 detect the pallet 4, and the sensors S3 to S5 detect the work piece W2. Reflection-type optical sensors may be used as these sensors. In the case of the present embodiment, the driving of the conveyance apparatuses 21 to 23 is stopped based on the detection results from the sensors S1 to S5, thereby stopping the conveyance of the pallet 4 and the work piece W2. In order to stop the conveyance of the pallet 4 and the work piece W2, a stopping device that abuts to the pallet 4 or the work piece W2 so as to mechanically stop the conveyance may also be used. The stopping device is disposed below the conveyance apparatuses 21 to 23 at a stopping position of the pallet 4 and the work piece W2; and in order to stop the conveyance of the pallet 4 or the work piece W2, the stopping device projects and abuts to the conveyance surfaces of the conveyance apparatuses 21 to 23. In order to release the stop of the conveyance, the stopping device is retracted below the conveyance surfaces.

There may also be provided sensors for detecting the pallet 4 or the work piece W2 other than the sensors S1 to S5. For example, a sensor for detecting the pallet 4 may be disposed at a downstream end of the conveyance apparatus 21 to detect passing of the pallet 4, thereby controlling the apparatuses in the downstream. In addition, a sensor for detecting the work piece W2 may be disposed at a downstream end of the conveyance apparatus 22 to detect passing of the work piece W2, thereby controlling the apparatus in the downstream.

The conveyance system 2 further includes operating units 24, 25. Each of the operating units 24, 25 includes a single button switch or plural button switches. At the conveyance origin 21a, the operator performs predetermined operation on the operating unit 24 after transferring the work piece W2 onto the pallet 4. Through this operation, it is possible to determine that the feed-in of the work piece W2 is completed. Meanwhile, at the conveyance destination 23a, when the operator completes the transfer of the work piece W2 onto the work piece W1, the operator performs predetermined operation on the operating unit 25. Through this operation, it is possible to determine that the feed-out of the work piece W2 is completed.

The pallet 4 and the push-up unit 270 will be described with reference to FIG. 4A and FIG. 4B. FIG. 4A is a plan view of the pallet 4, and FIG. 4B is a plan view of the push-up unit 270.

The pallet 4 includes a body 40 and plural positioning portions 41. The body 40 is a platelike member. In the case of the present embodiment, as described later, the push-up unit 270 is pushed up above the body 40, thereby transferring the work piece W2 from the pallet 4 to the push-up unit 270. Accordingly, the body 40 has such a shape that avoids interference with the push-up unit 270 and interference with the rods 271a.

Specifically, the body 40 includes an aperture 43 ranging from a center portion to one end (downstream end) of the body 40. The aperture 43 includes a central aperture 43a and a cut-out portion 43b. The central aperture 43a is formed in a manner as to avoid interference with the push-up unit 270 as shown in FIG. 4B. The push-up unit 270 can pass through the aperture 43a. The cut-out portion 43b is formed in a manner as to be continued from the aperture 43a to the downstream end of the body 40. When the pallet 4 is moved toward the upstream with the rods 271a extending through the aperture 43a, the rods 271a pass through the cut-out portion 43b, and thus the interference between the body 40 and the rods 271a can be avoided.

In the case of the present embodiment, each of the positioning portions 41 has a pin shape projecting upward from the body 40. Each positioning portion 41 is engaged with a corresponding hole for positioning formed in the work piece W2, thereby positioning the work piece W2 relative to the pallet 4. The work piece W2 is placed and positioned on the pallet 4 through the engagement with the positioning portions 41 and the abutting to partial regions 42 of the body 40.

The push-up unit 270 includes a body 270a in a platelike shape, and plural support pins 270b. The body 270a is connected to the upper ends of the rods 271a so that the push-up unit 270 is moved upward and downward by the driving mechanism 271 while the push-up unit 270 is retained in a horizontal posture. In the case of the present embodiment, the body 270a is formed in a comb-like shape. Configuration of forming the body 270a in a comb-like shape attains reduction in weight. The body 270a formed in a comb-like shape also avoids interference with the rollers HR, and makes the width of the body 270a greater. Through this configuration, the work piece W2 can be moved upward and downward in a more stable manner.

The support pins 270b are uprightly provided on the body 270a, and abut the work piece W2 so as to support this work piece W2. Each of the support pins 270b is engaged with a corresponding hole for positioning in the work piece W2. This engagement enables the work piece W2 to be positioned relative to the push-up unit 270. The work piece W2 is placed and positioned on the push-up unit 270 through the engagement with the support pins 270b and the abutting to the partial regions 270c of the body 270a.

<Control Unit>

A configuration of a control system in the conveyance system 2 will be described as follows. FIG. 4C is a block diagram of a control unit 28 that controls the conveyance system 2. In the case of the present embodiment, the control unit 28 includes two control circuits 28A and 28B. Needless to mention, these control circuits may be constituted by a single control circuit.

The control circuit 28A mainly controls the conveyance apparatuses 21 to 23, and the control circuit 28B mainly controls the lifting apparatus 27 and the processing apparatus 200. Each of the control circuits 28A and 28B includes a processing unit 281 such as a CPU, a storage unit 282 such as a RAM and a ROM, and an interface unit 283 that provides an interface between external devices and the processing unit 281. The interface unit 283 includes a communication interface that provides communication between the control circuits 28A and 28B. The interface unit 283 may further include a communication interface that provides communication with a host computer (not shown). The host computer may be a computer for comprehensively controlling the production facilities A, for example.

The processing unit 281 executes a program stored on the storage unit 282, and controls various actuators 285, 287 based on detection results from various sensors 284, 286, and instructions from the other control circuit (28A or 28B).

The sensors 284 include the sensors S1 to S5, operation detecting sensors included in the operating units 24, 25, and the like, for example. The actuators 285 include respective driving sources of the driving units 210, 220, 221, and 230 to 232, for example.

The various sensors 286 include respective sensors included in the lifting apparatus 27 and the processing apparatus 200, and the actuators 287 include respective driving sources included in the lifting apparatus 27 and the processing apparatus 200.

<Control Example>

A control example of the control units 28 will be described with reference to FIG. 5A to FIG. 9B. FIG. 5A to FIG. 9B schematically show an example of operation of the conveyance system 2. An example of the operation from the feed-in to the feed-out of the work piece W2 will be described, herein.

FIG. 5A shows a stage where the operator H transfers the work piece W2 onto the pallet 4 at the conveyance origin 21a. This pallet 4 is located at the conveyance origin 21a, and the operator H manually places the work piece W2 onto the pallet 4. At this time, the operator H can position the work piece W2 relative to the pallet 4 by engaging the work piece W2 with the positioning portions 41.

If completing the transfer of the work piece W2, the operator H carries out transfer-completion operation on the operating unit 24 (FIG. 2). In response to detection of this operation, the pallet 4 is started to be conveyed (FIG. 5B), and the rollers R and the rollers HR of the conveyance apparatuses 21 and 22 are driven to roll. The rollers R and the rollers RH roll in a manner as to convey the pallet 4 on which the work piece W2 is conveyed in the conveyance direction D2. This rolling direction is referred to as a "forward direction", and rolling in an opposite direction is referred to as rolling in a "reverse direction". The pallet 4 guided by the guide members 26 (FIG. 2, FIG. 3A) is straightly conveyed in a positioned state, so that the work piece W2 is also straightly conveyed in a positioned state.

If the pallet 4 on which the work piece W2 is placed is detected by the sensor S2, the pallet 4 is conveyed to a predefined position, and then the conveyance of the pallet 4 is stopped (FIG. 6A). As shown in FIG. 4B, the positional relation between the pallet 4 and the push-up unit 270 at this time is such that the push-up unit 270 is located immediately below the aperture 43a.

The lifting apparatus 27 is driven to lift up the push-up unit 270 (FIG. 6B). The push-up unit 270 is lifted up through the opening OP and the aperture 43a to push up the work piece W2. Through this movement, the work piece W2 placed on the pallet 4 on the conveyance apparatus 22 is separated up from the pallet 4 to be transferred to the push-up unit 270.

Figure 7A:
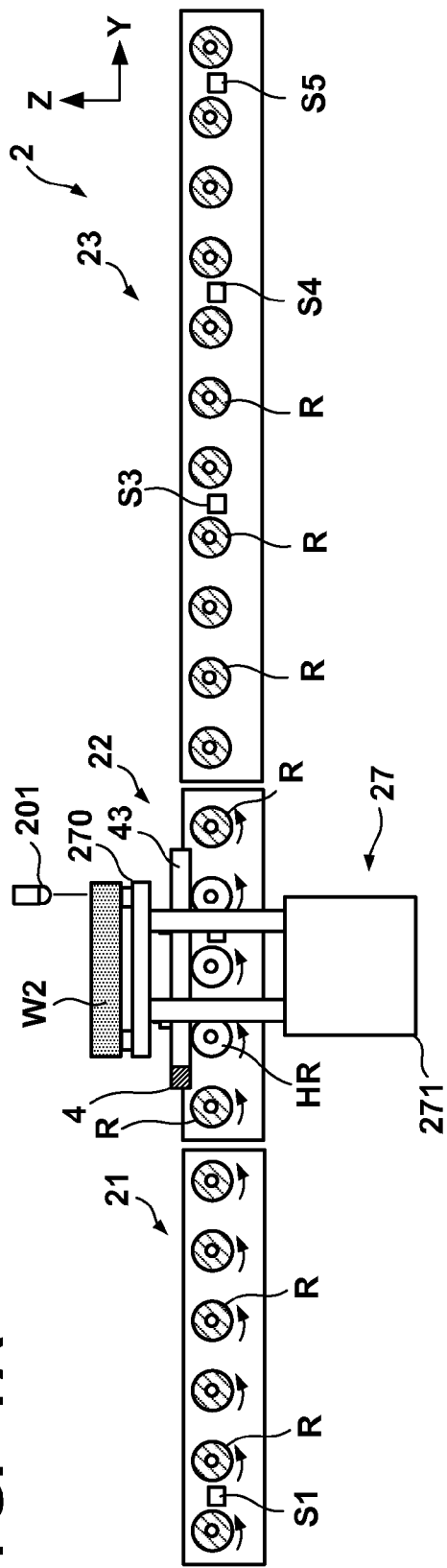
FIG. 7A and FIG. 7B are explanatory views of the operation of the conveyance system in FIG. 2.
Figure 7B:
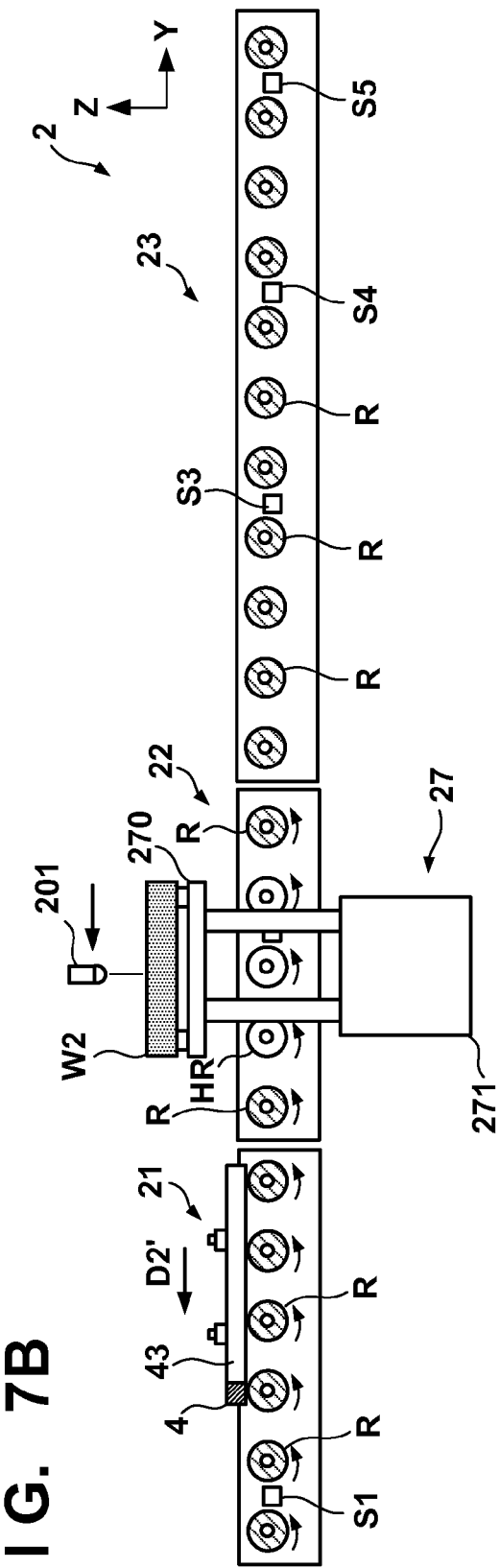

Subsequently, the processing by the processing apparatus 200 and returning of the pallet 4 that is empty are carried out (FIG. 7A and FIG. 7B). Specifically, while the processing apparatus 200 is injecting atmospheric pressure plasma from the jet nozzle 201 to the adhesive surface of the work piece W2, the injection position is moved by the movement mechanism 202 (FIG. 3B). Meanwhile, the conveyance apparatus 22 and the conveyance apparatus 21 respectively roll the rollers R and the rollers HR in the reverse direction, thereby conveying (returning) the empty pallet 4 (pallet on which no work piece W2 is placed) in the reverse direction D2' inverse to the conveyance direction D2. In this manner, in the present embodiment, the conveyance apparatuses 21 and 22 also carry out the pallet returning. At this time, the cut-out portion 43b is formed in the pallet 4, and thus there is no interference between the rods 271a of the lifting apparatus 27 and the pallet 4.

When the empty pallet 4 is detected by the sensor S1, the empty pallet 4 is conveyed to the predefined position, and thereafter, the conveyance by the conveyance apparatus 22 and the conveyance apparatus 21 is stopped (FIG. 8A). Before being detected by the sensor S1, the empty pallet 4 shifts to the conveyance apparatus 21 from the conveyance apparatus 22; therefore, the conveyance by the conveyance apparatus 22 may be stopped earlier than the conveyance apparatus 21.

If the processing on the work piece W2 by the processing apparatus 200 is completed, the lifting apparatus 27 is driven to move the push-up unit 270 downward (FIG. 8A). The push-up unit 270 is moved downward through the opening OP and the aperture 43a. While passing therethrough, the work piece W2 is moved down to be placed onto the conveyance apparatus 22 (onto the conveyance surfaces of the rollers R and the rollers HR).

Subsequently, the rollers R and the rollers HR of the conveyance apparatuses 22 and 23 are respectively driven to roll (FIG. 8B). The rollers R and the rollers HR are driven to roll in the forward direction, thereby conveying the work piece W2 in the conveyance direction D2. At the conveyance origin 21a, the operator H is allowed to perform operation of placing a next work piece W2 (this work piece W2 is referred to as a "subsequent work piece", and the former work piece W2 is referred to as a "previous work piece") on the pallet 4.

When the previous work piece W2 is detected by the sensor S5, the previous work piece W2 is conveyed to a predefined position at the conveyance destination 23a, and the conveyance is stopped (FIG. 9A). The operator H takes out the previous work piece W2 from the conveyance apparatus 23, and carries out the operation of bonding the previous work piece W2 onto the work piece W1 on the conveyance system 1 (FIG. 1). The operator H performs the transfer-completion operation on the operating unit 25 (FIG. 2). Through this operation, the conveyance and the processing for a single work piece W2 of interest is completed. In the upstream, the same control is carried out on the subsequent work piece W2, and this production work is progressing.

In the conveyance system 1 (FIG. 1), since the work piece W1 is subjected to respective processing at the processing station 10 and the processing station 12, a time period from the conveyance start to the conveyance end of the work piece W1 might become longer than a time period from the conveyance start to the conveyance end of the work piece W2 in the conveyance system 2. In this case, a plurality of work pieces W2 may be waited on the conveyance apparatus 23.

As aforementioned, in the case of the present embodiment, it is configured that the rollers R included in the conveyance apparatus 23 are classified into three groups in the conveyance direction D2, and each group is driven individually. Hence, as shown in FIG. 9B, a single work piece W2 can be waited in each group, that is, three work pieces W2 can be waited in total. The conveyance apparatus 23 is used as a buffer of the work pieces W2, thereby compensating for a difference in operation time between the conveyance system 1 and the conveyance system 2.

As aforementioned, in the present embodiment, from the conveyance origin 21a to the processing station 20, the work piece W2 is conveyed using the pallet 4; thus the work piece W2 is unlikely to be out of position during the conveyance. Accordingly, it is possible to secure positioning accuracy of the work piece W2 at the processing station 20 without requiring an additional positioning apparatus. Meanwhile, the pallet returning of the empty pallet 4 is carried out through the reverse conveyance by the conveyance apparatuses 21 and 22. Accordingly, no additional mechanism to return the empty pallet 4 is required. Specifically, the work pieces W2 are supplied to the processing station 20 through the shuttle conveyance of the pallet 4. Hence, only a single pallet 4 is substantially required, and it is sufficient to prepare several pallets including spare pallets at most. Accordingly, it is unnecessary to prepare a number of pallets as required in conventional arts.

With the aperture 43 formed in the pallet 4, it is possible to transfer the work piece W2 from the pallet 4 to the lifting apparatus 27 at the processing station 20 with a simple configuration. In addition, it is possible to return the empty pallet 4 before completing the processing on the work piece W2 by the processing apparatus 200, thereby enhancing productive efficiency.

<Another Embodiment>
<Another Example of Push-Up Unit>

Figure 10A:
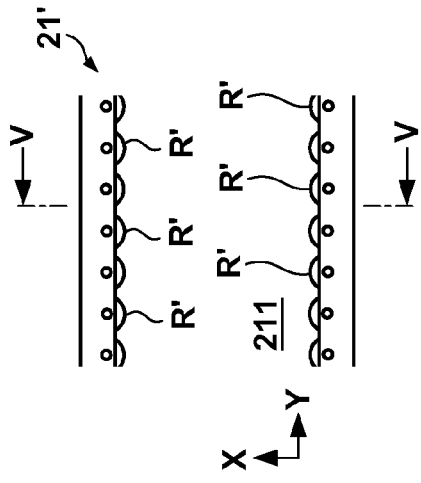
FIG. 10A and FIG. 10B are explanatory views of a push-up unit in another example.
Figure 10C:
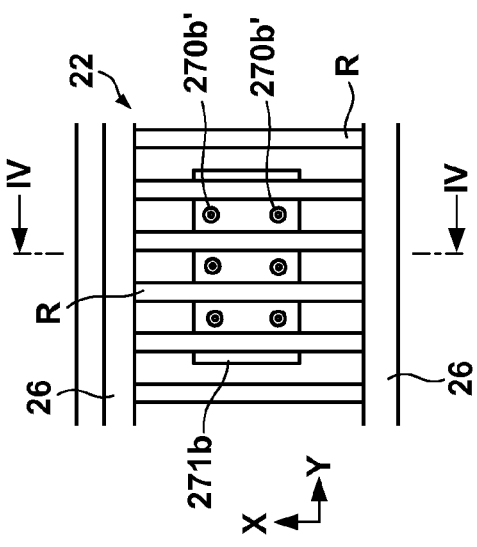
FIG. 10C and FIG. 10D are explanatory views of a conveyor in another example.
Figure 10B:
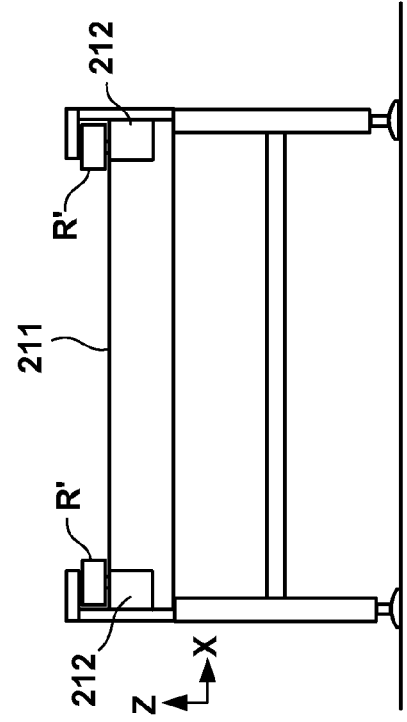

In the aforementioned embodiment, the short rollers HR are employed so as to form the opening OP that secures space through which the push-up unit 270 passes. However, it may be configured to utilize only space between the respective adjacent rollers R without employing the short rollers HR. FIG. 10A and FIG. 10B show one example of this. FIG. 10A is a plan view of the vicinity of the conveyance apparatus 22, and FIG. 10B is an arrow view taken along line IV-IV in FIG. 10A.

In the example of the above drawings, a push-up unit 270b' of the lifting apparatus 27 is constituted by only long support pins, and instead of using the body 270a, the driving mechanism 271 includes a base member 271b that supports the push-up unit 270b'. In FIG. 10B, solid lines indicate a state in which the push-up unit 270b' is located below the conveyance apparatus 22, and two-dot chain lines indicate a state in which the push-up unit 270b' pushes and moves up the work piece W2. The base member 271b is located below the conveyance apparatus 22 all the time.

The rollers of the conveyance apparatus 22 are constituted by only the rollers R having the same entire length, and no short rollers HR are employed. The push-up unit 270b' moves the work piece W2 upward and downward through the space between the respective adjacent rollers R.

With the above configuration, it is possible to configure the conveyance apparatus using only the rollers R having the same entire length.

<Another Example of Conveyance Apparatus>

Figure 10D:
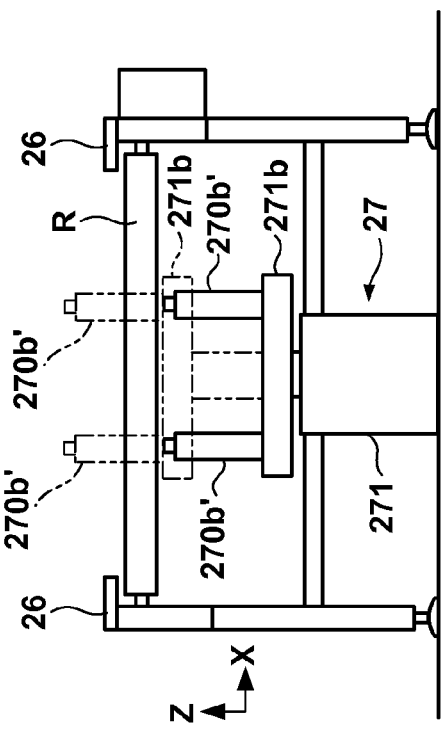

In the above embodiment, it is configured that the pallet 4 is conveyed by the rollers R, and the pallet 4 is so guided by the guide members 26 as to straightly travel; and it may also be configured to perform the conveyance and the traveling guide of the pallet 4 using only rollers having a function as the guide members 26. FIG. 10C and FIG. 10D show one example of this. FIG. 10C is a plan view showing another example of the conveyance apparatus, and FIG. 10D is an arrow view taken along line V-V in FIG. 10C.

In the example of the above drawings, plural driven rollers R' whose rolling axial direction is the Z direction are provided along the Y direction, and these driven rollers R' serve as a pallet conveyance mechanism as well as a pallet guiding mechanism. Each driven roller R' is rollably driven by the driving unit 212. The pallet 4 (not shown in FIG. 10C and FIG. 10D) is placed on a table 211. The table 211 has a smooth surface so that the pallet 4 is smoothly slidable on the table 211.

A spaced distance between two rows of the driven rollers R' is set in accordance with the width of the pallet 4 in the X direction. Hence, rolling of the driven rollers R' conveys the pallet 4, and guides the pallet 4 to straightly travel, as well. Instead of the table 211, a ball transfer (free bearing) or a free roller conveyor may be used.

<Installation of Light Curtain>

Figure 11:
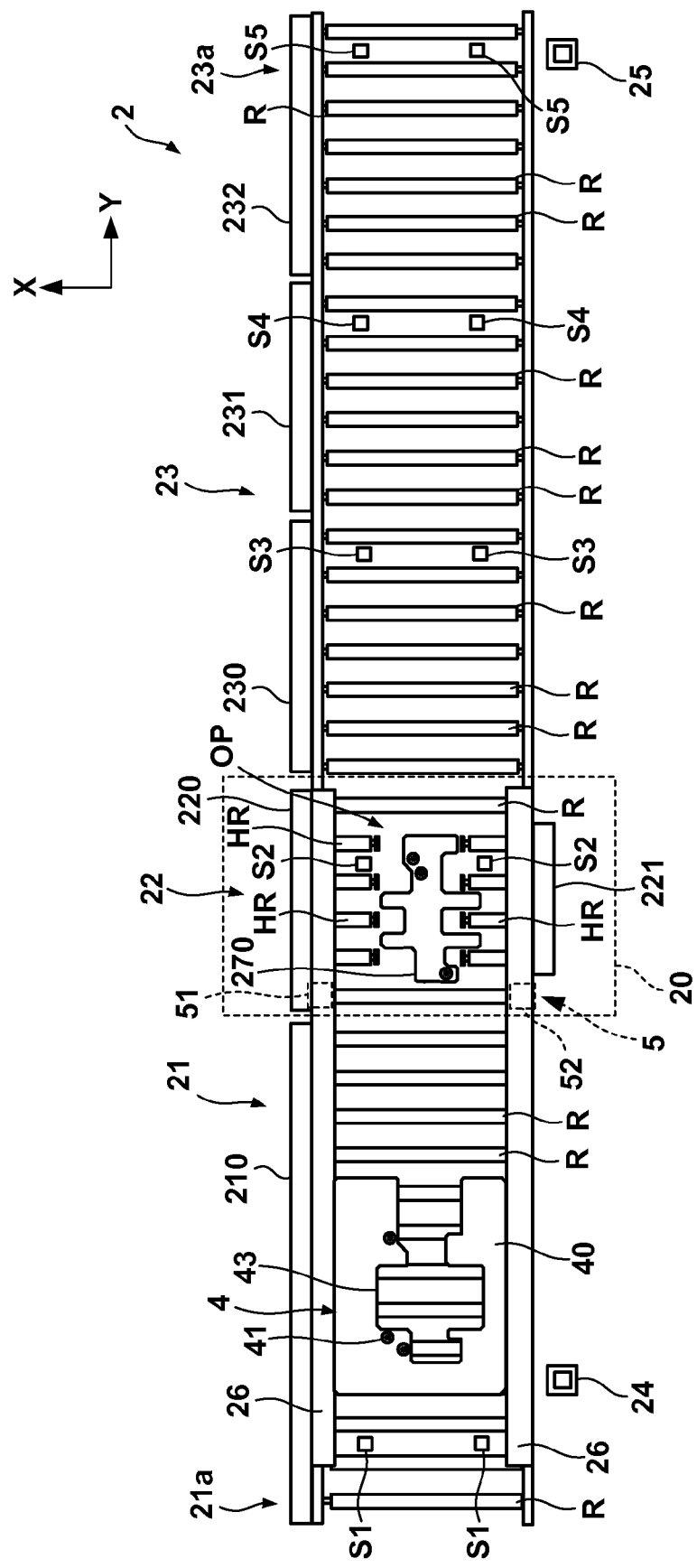
FIG. 11 shows a layout of a conveyance system provided with a light curtain.

It may be configured to install a light curtain at a feed-in entrance (in the upstream of the conveyance direction) of the processing station 20 so as to detect intrusion of an unexpected object into the processing station 20. FIG. 11 shows one example of this. In the example of FIG. 11, the light curtain 5 is installed at the feed-in entrance (end located on the conveyance origin 21a side) of the processing station 20. The light curtain may be installed at a feed-out exit (in the downstream of the conveyance direction) of the processing station 20.

In the case of the present embodiment, the light curtain (multiple beam axis photoelectric sensor) 5 includes a light-projecting unit 51 and a light-detecting unit 52, and these units are spaced apart in the X direction.

Figure 12A:
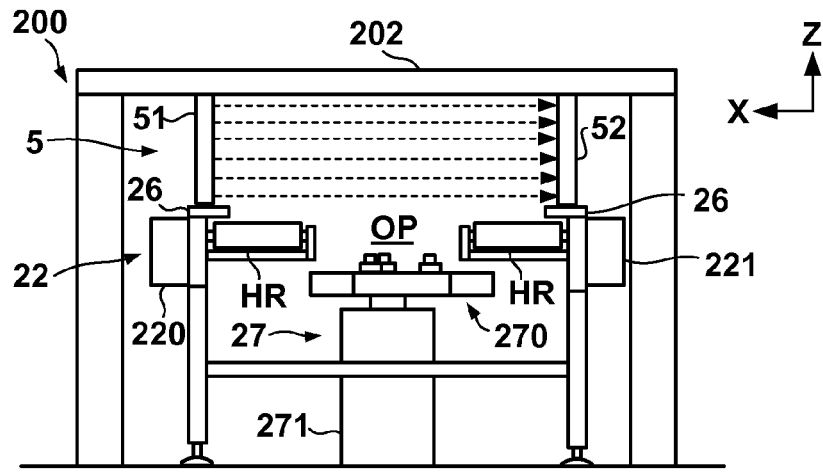
FIG. 12A to FIG. 12C are explanatory views of the light curtain.

FIG. 12A is an explanatory view of the light curtain 5, and a drawing of the processing station 20 viewed from the feed-in entrance thereof. The light-projecting unit 51 and the light-detecting unit 52 are disposed opposite to each other at a position where the conveyance of the pallet 4 and the work piece W2 is not impeded. The light-projecting unit 51 is located above one end in the X direction of the conveyance apparatus 22, and the light-detecting unit 52 is located above the other end in the X direction of the conveyance apparatus 22, respectively.

The light-projecting unit 51 includes plural light-emitting elements that are arranged in the Z direction, and each light-emitting element projects light to the light-detecting unit 52. The light-detecting unit 52 includes plural light-receiving elements that are arranged in the Z direction, and each light-receiving element receives the light emitted from the light-projecting unit 51.

If a foreign matter passes through between the light-projecting unit 51 and the light-detecting unit 52, at least part of the light emitted from the light-projecting unit 51 is blocked, so that reduction in light income or disability of light receiving occurs in at least some of the plural light-receiving elements included in the light-detecting unit 52. Through this configuration, passing of the foreign matters is detected, and thus the line operation is stopped, for example. If the foreign matter is a hand or a finger of the operator, the line operation is immediately stopped at the moment that the foreign matter intrudes into the processing station 20, thereby securing safety of the operator.

In the case of the present embodiment, in the processing station 20, the work piece W2 placed on the pallet 4 is fed in the feed-in entrance of the processing station 20, and the empty pallet 4 is returned from the feed-in entrance to the conveyance origin 21a after the work piece W2 is processed. A conveyance height from the conveyance surface at the time of conveying the pallet 4 on which the work piece W2 is placed becomes higher than a conveyance height of the empty pallet 4. Hence, the detecting range of the light curtain 5 may be changed.

Figure 12B:
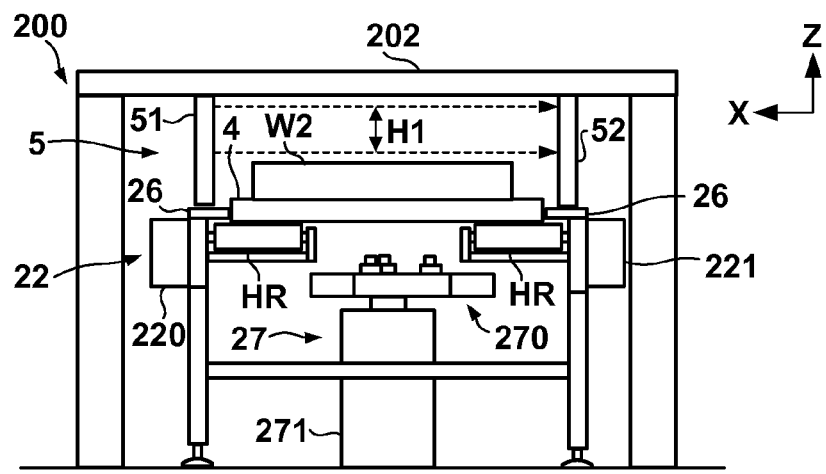
Figure 12C:
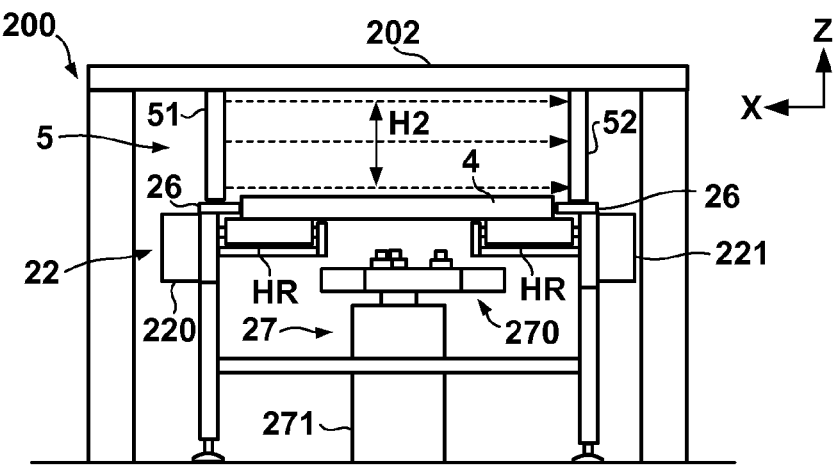

FIG. 12B and FIG. 12C show one example of this. FIG. 12B shows a detecting range H1 in the Z direction of the light curtain 5 at the time of feeding in the work piece W2 placed on the pallet 4. FIG. 12C shows a detecting range H2 in the Z direction of the light curtain 5 at the time of returning the empty pallet 4. The detecting range H1 is set to be smaller than the detecting range H2 so as to prevent the work piece W2 from being erroneously detected as a foreign matter. The detecting range H2 is set to be greater than the detecting range H1 by the height of the work piece W2, thereby enhancing accuracy of detection of a foreign matter.

Specifically, the detecting ranges H1 and H2 are adjusted such that a difference between the detecting ranges H1 and H2 is equal to the height of the work piece W2.

When the work piece W2 is fed in, that is, when the work piece W2 is placed on the pallet 4, the detection is carried out by the light-emitting elements and the light-receiving elements corresponding to the detecting range H1, and when the empty pallet 4 is returned after the work piece W2 is processed, the detection is carried out by the light-emitting elements and the light-receiving elements corresponding to the detecting range H2.

Through this configuration, without stopping the line operation, it is possible to feed the pallet 4 on which the work piece W2 is placed into the processing station 20, and return the empty pallet 4.

If a foreign matter is detected by the light curtain 5, it is possible to take an action such as notifying the detecting of the foreign matter, stopping the conveyance apparatuses 21 to 23, and stopping the processing station 20.

Depending on the detecting ranges H1, H2, the light-projecting unit 51 and the light-detecting unit 52 may be provided vertically in plural stages, for example, in two stages. The detecting range may be selected in such a manner that only the light-projecting unit 51 and the light-detecting unit 52 in the upper stage are set to be ON if the detecting range H1 is selected, and the light-projecting units 51 and the light-detecting units 52 in the upper and the lower stages are set to be ON if the detecting range H2 is selected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application Nos. 2014-146284, filed Jul. 16, 2014 and 2015-080341, filed Apr. 9, 2015, which are hereby incorporated by reference herein in their entirety.

What is claimed is:

1. A conveyance system including a processing station that processes a work piece fed in and feeds out the work piece after being processed, said conveyance system comprising:
　a first conveyance apparatus that feeds in the work piece into said processing station;
　a second conveyance apparatus provided in said processing station and disposed subsequently adjacent to said first conveyance apparatus at a downstream side of said first conveyance apparatus in a conveyance direction of the work piece;

a third conveyance apparatus disposed subsequently adjacent to said second conveyance apparatus at a downstream side of said second conveyance apparatus in the conveyance direction, said third conveyance apparatus conveying the work piece fed out from said processing station;

a lifting apparatus disposed below said second conveyance apparatus in said processing station and moving the work piece upward and downward; and a processing apparatus disposed in said processing station and processing the work piece lifted up by said lifting apparatus, wherein said first conveyance apparatus performs conveyance of a pallet on which the work piece is placed in the conveyance direction and returning of the pallet that is empty in a direction reverse to the conveyance direction, said second conveyance apparatus performs conveyance of the pallet on which the work piece is placed in the conveyance direction, returning of the pallet that is empty in the direction reverse to the conveyance direction and conveyance of the work piece in the conveyance direction, said lifting apparatus performs lifting of the work piece placed on the pallet on said second conveyance apparatus and moving the work piece down onto said second conveyance apparatus, and said third conveyance apparatus performs the conveyance of the work piece in the conveyance direction.

2. The conveyance system according to claim 1, wherein said lifting apparatus comprises:

a push-up unit passing through said second conveyance apparatus in an upward and downward direction, the work piece being placed on said push-up unit; and a driving mechanism moving said push-up unit upward and downward.

3. The conveyance system according to claim 2, wherein the pallet has a shape that avoids interference with said push-up unit.

4. The conveyance system according to claim 1, wherein each of said first conveyance apparatus to said third conveyance apparatus comprises a roller conveyor.

5. The conveyance system according to claim 2, wherein said push-up unit comprises:

a body connected to said driving mechanism; and plural support pins uprightly provided on said body so as to abut the work piece.

6. The conveyance system according to claim 2, wherein the pallet comprises:

an aperture formed at a center of the pallet, said push-up unit being able to pass through said aperture;

a positioning portion for positioning the work piece; and a cut-out portion formed from said aperture to a downstream end of the pallet in the conveyance direction.

7. The conveyance system according to claim 6, wherein said second conveyance apparatus comprises a roller conveyor including plural driven rollers, said plural driven rollers include plural pairs of short rollers disposed opposite to each other relative to a rolling axial direction, and said aperture through which said push-up unit is able to pass is formed by a space between said plural pairs of short rollers.

8. The conveyance system according to claim 1, wherein each of said first conveyance apparatus and said second conveyance apparatus includes a guide member that guides traveling of the pallet.

9. The conveyance system according to claim 1, wherein each of said first conveyance apparatus and said second conveyance apparatus includes plural driven rollers that guide traveling of the pallet as well as convey the pallet.

10. The conveyance system according to claim 1, further comprising a light curtain that detects a foreign matter intruding into said processing station, wherein a detecting range of the light curtain at a time of feeding in the pallet on which the work piece is placed into said processing station is set to be different from a detecting range of the light curtain at a time of returning the pallet that is empty from said processing station.

11. A conveyance method for conveying a work piece from an upstream of a conveyance direction of the work piece through a processing station to a downstream of the conveyance direction, said conveyance method comprising:

a pallet conveyance step of moving a pallet on which the work piece is placed in the conveyance direction on a predetermined conveyance surface so as to convey the pallet to said processing station;

a separating step of moving the work piece placed on the pallet that has reached said processing station upward from the conveyance surface so as to separate the work piece from the pallet;

a pallet returning step of returning the pallet, which is empty after the work piece is lifted up, toward the upstream of the conveyance direction on the conveyance surface;

a processing step of processing the work piece lifted up in said separating step at said processing station;

a moving-down step of moving the work piece after being processed down onto the conveyance surface; and a work-piece conveyance step of conveying the work piece put down onto the conveyance surface in the conveyance direction.

* * * * *